(12) United States Patent
Shido

(10) Patent No.: US 11,309,843 B2
(45) Date of Patent: Apr. 19, 2022

(54) INPUT RECEIVER

(71) Applicant: Winbond Electronics Corp., Taichung (TW)

(72) Inventor: Taihei Shido, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/340,103

(22) Filed: Jun. 7, 2021

(65) Prior Publication Data

US 2021/0399687 A1    Dec. 23, 2021

(30) Foreign Application Priority Data

Jun. 23, 2020  (JP) .............................. JP2020-107842

(51) Int. Cl.
*H03F 1/02* (2006.01)
*G11C 7/10* (2006.01)
*H03F 3/45* (2006.01)

(52) U.S. Cl.
CPC ......... *H03F 1/0205* (2013.01); *G11C 7/1078* (2013.01); *H03F 3/45269* (2013.01)

(58) Field of Classification Search
CPC .................................................... H03F 1/0205
See application file for complete search history.

(56) References Cited

U.S. PATENT DOCUMENTS

| | | | |
|---|---|---|---|
| 5,900,780 A * | 5/1999 | Hirose | H03F 3/3001 330/253 |
| 6,806,744 B1 | 10/2004 | Bell et al. | |
| 7,174,143 B1 * | 2/2007 | Turvey | H03F 1/08 455/114.2 |
| 7,342,418 B2 | 3/2008 | Moon | |
| 7,558,125 B2 | 7/2009 | Blodgett | |

(Continued)

FOREIGN PATENT DOCUMENTS

| | | |
|---|---|---|
| CN | 100501864 | 6/2009 |
| TW | I271035 | 1/2007 |

(Continued)

OTHER PUBLICATIONS

"Office Action of Taiwan Counterpart Application", dated Dec. 30, 2020, p. 1-p. 4.

*Primary Examiner* — Patricia T Nguyen
(74) *Attorney, Agent, or Firm* — JCIPRNET

(57) ABSTRACT

An input receiver includes a first current source circuit, a second current source circuit, a first rail-to-rail amplifier circuit, a first inverter circuit, and a second inverter circuit. The first current source circuit adjusts an operating current flowing through a first node according to a first bias signal. The second current source circuit adjusts a ground current flowing through a second node according to a second bias signal. The first rail-to-rail amplifier circuit and the first inverter circuit are connected in parallel between the first node and the second node. The first rail-to-rail amplifier circuit receives an input signal and compares the input signal with a reference voltage and accordingly outputs an amplified signal. The second inverter circuit is coupled between an operating voltage and a ground voltage. The second inverter circuit generates an output signal according to an inverted signal outputted by the first inverter circuit.

12 Claims, 6 Drawing Sheets

(56) References Cited

U.S. PATENT DOCUMENTS

| | | | |
|---|---|---|---|
| 8,773,179 B2 | 7/2014 | Chang et al. | |
| 9,094,003 B2 | 7/2015 | Kim | |
| 10,084,414 B2* | 9/2018 | Vigraham | H03F 1/26 |
| 2007/0024368 A1* | 2/2007 | Abdelatty Ali | H03F 3/45192 |
| | | | 330/259 |
| 2014/0139267 A1* | 5/2014 | Wang | H03F 3/45183 |
| | | | 327/108 |

FOREIGN PATENT DOCUMENTS

| | | |
|---|---|---|
| WO | 2009140656 | 11/2009 |
| WO | 2016025070 | 2/2016 |

* cited by examiner

INPUT RECEIVER

CROSS-REFERENCE TO RELATED APPLICATION

This application claims the priority benefit of Japan application serial no. 2020-107842, filed on Jun. 23, 2020. The entirety of the above-mentioned patent application is hereby incorporated by reference herein and made a part of this specification.

BACKGROUND

Technical Field

The disclosure relates to an input receiver, and in particular, relates to an input receiver adopting a multilevel inverter circuit structure.

Description of Related Art

Semiconductor devices such as dynamic random access memory (DRAM) are provided with input receivers configured to receive external input signals. Generally, in an input receiver, an input signal is compared with a reference voltage, and according to the voltage difference therebetween, a differential-type amplifier circuit configured to amplify a signal is generated.

In a conventional design, an input receiver may perform operations correctly in a high-speed environment through an output-level shunt resistor disposed in the input receiver. Nevertheless, due to the effect of leakage current, the use of the shunt resistor may lead to additional power consumption, overall DRAM performance is thereby lowered.

SUMMARY

The disclosure provides an input receiver in which an inverter circuit structure connected to an amplifier circuit in parallel between nodes is used to replace a shunt resistor used in a conventional design.

An input receiver provided by the disclosure includes a first current source circuit, a second current source circuit, a first rail-to-rail amplifier circuit, a first inverter circuit, and a second inverter circuit. The first current source circuit is coupled between an operating voltage and a first node and adjusts an operating current flowing through the first node according to a first bias signal. The second current source circuit is coupled between a second node and a ground voltage and adjusts a ground current flowing through the second node according to a second bias signal. The first rail-to-rail amplifier circuit is coupled between the first node and the second node. The first rail-to-rail amplifier circuit receives an input signal and compares the input signal with a reference voltage and accordingly outputs an amplified signal. The first inverter circuit is connected to the first rail-to-rail amplifier circuit in parallel between the first node and the second node. The first inverter circuit is configured to receive the amplified signal and provide an inverted signal. The second inverter circuit is coupled between an operating voltage and a ground voltage. The second inverter circuit is configured to generate an output signal according to the inverted signal.

To sum up, in the input receiver provided by the disclosure, the inverter circuit and the rail-to-rail amplifier circuit are connected in parallel between two nodes. Since the inverter circuit may be configured to be operated in voltage swing equal to the amplified signal outputted by the rail-to-rail amplifier circuit, the input receiver may not only perform operations correctly in a high-speed environment but also may work at a high operating speed and require low power consumption.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
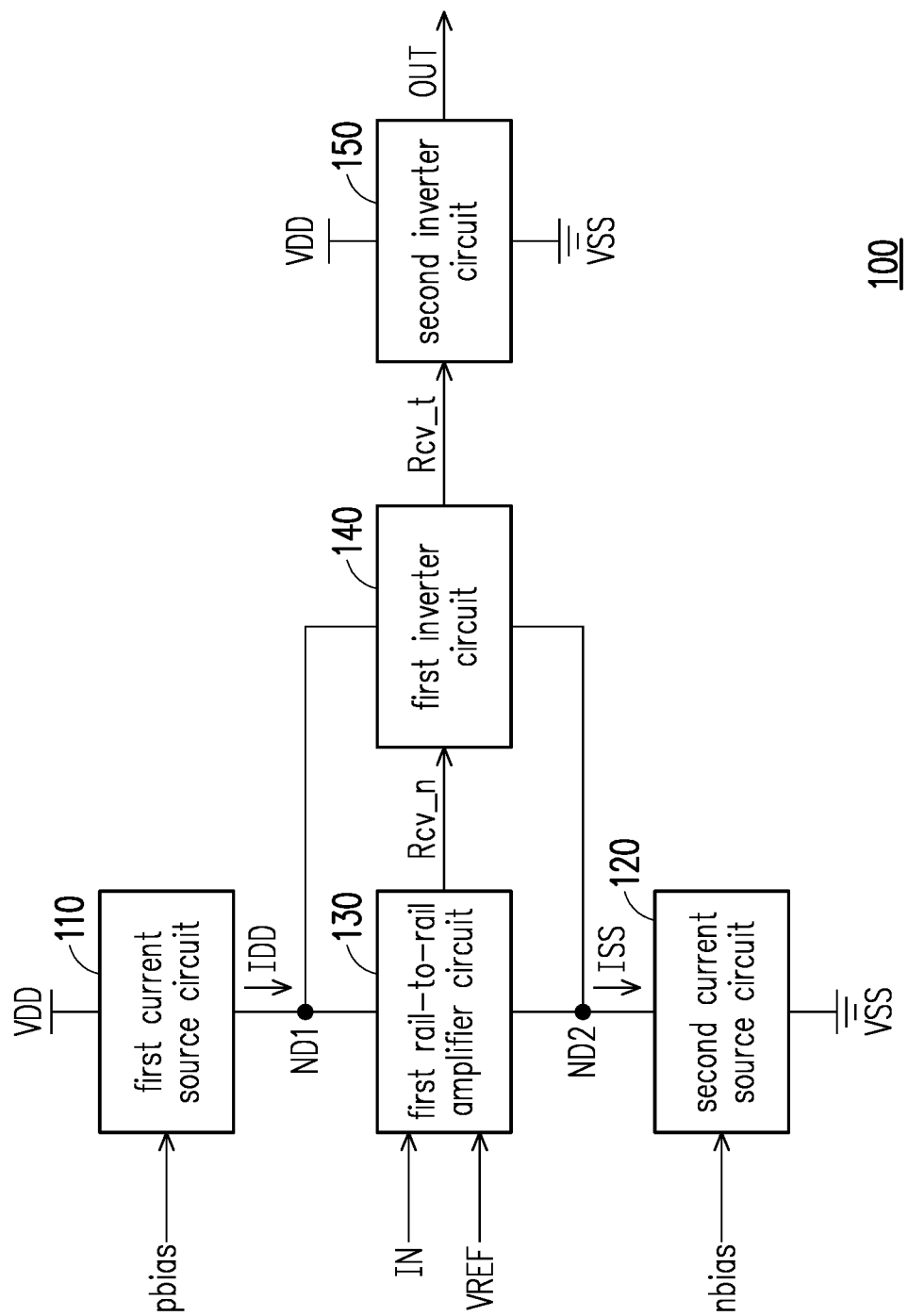
FIG. 1 is a schematic diagram illustrating blocks of an input receiver according to an embodiment of the disclosure.
Figure 2:
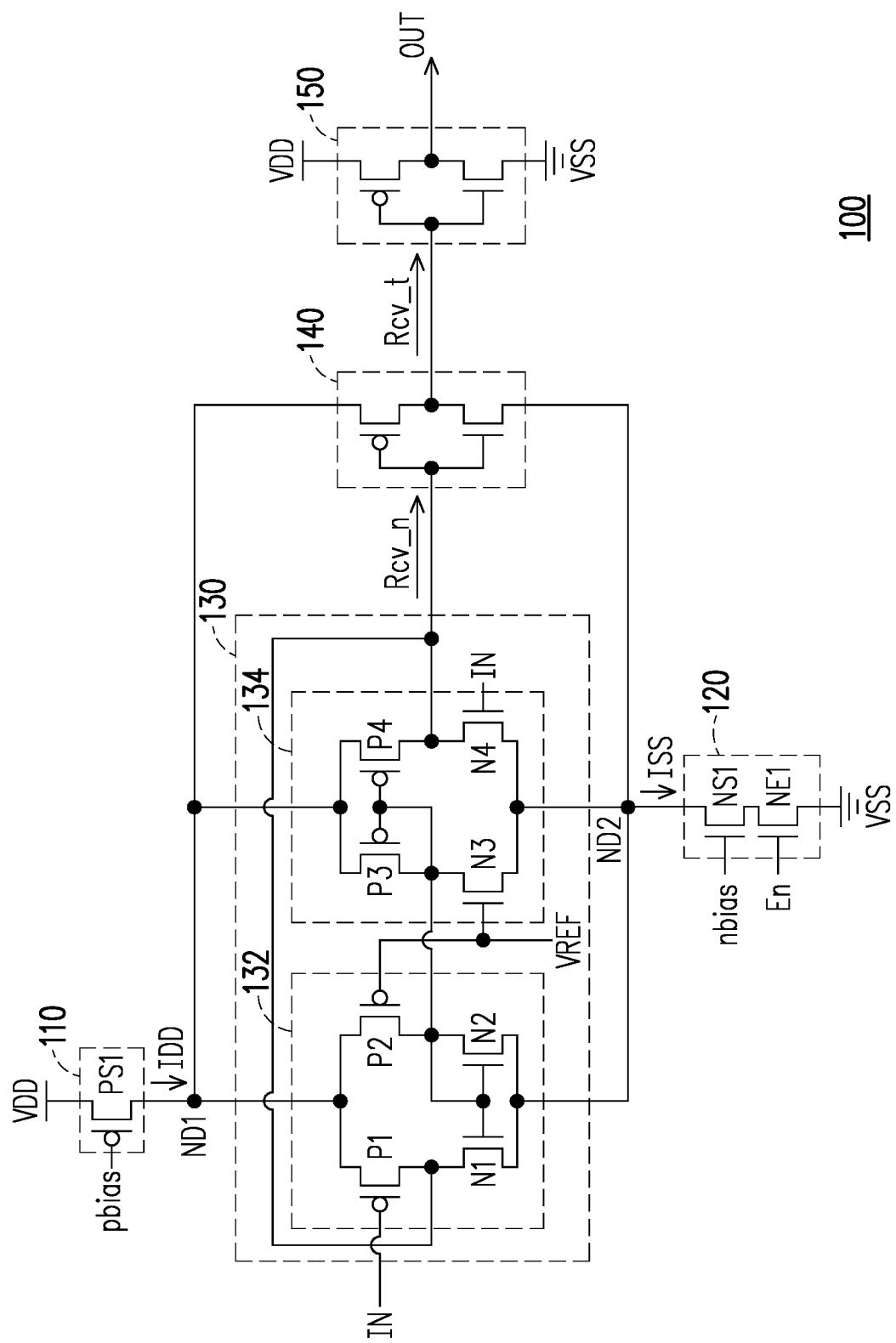
FIG. 2 is a schematic diagram of circuits of the input receiver of FIG. 1.

FIG. 1 is a schematic diagram illustrating blocks of an input receiver according to an embodiment of the disclosure, and FIG. 2 is a schematic diagram of circuits of the input receiver of FIG. 1. With reference to FIG. 1 and FIG. 2 together, an input receiver 100 is suitable for a volatile memory component such as DRAM and static random access memory (SRAM) as well as a non-volatile memory component such as flash memory, phase change memory, resistive memory, or other circuit components that need to interpret a logic level of an input signal. In the present embodiment, the input receiver 100 includes a first current source circuit 110, a second current source circuit 120, a first rail-to-rail amplifier circuit 130, a first inverter circuit 140, and a second inverter circuit 150.

The first current source circuit 110 is coupled between an operating voltage VDD and a first node ND1. The first current source circuit 110 may adjust an operating current IDD flowing through the first node ND1 according to a first bias signal pbias. As shown in FIG. 2, the first current source circuit 110 includes a current source formed by a transistor PS1 providing the operating current IDD according to the first bias signal pbias.

The second current source circuit 120 is coupled between a second node ND2 and a ground voltage VSS. The second current source circuit 120 may adjust a ground current ISS flowing through the second node ND2 according to a second bias signal nbias. As shown in FIG. 2, the second current source circuit 120 includes a current source formed by a transistor NS1 and an enabling transistor NE1. The transistor NS1 provides the ground current ISS according to the second bias signal nbias. The enabling transistor NE1 is connected in series to the transistor NS1 on a circuit path between the second node ND2 and the ground voltage VSS and is turned on or turned off according to an enabled signal En. The enabled signal En indicates that whether the input receiver 100 is enabled. For instance, when the enabled signal En is at a low logic level, the enabling transistor NE1 is turned off, and the input receiver 100 may not function.

When the enabled signal En is at a high logic level, the enabling transistor NE1 is turned on, and the input receiver 100 may function. In this embodiment, the enabling transistor NE1 is coupled between the transistor NS1 and the ground voltage VSS, but in another embodiment, the enabling transistor NE1 may also be coupled between the second node ND2 and the transistor NS1, and which should not be construed as limitations to the disclosure.

The first rail-to-rail amplifier circuit 130 is coupled between the first node ND1 and the second node ND2. The first rail-to-rail amplifier circuit 130 is configured to receive an input signal IN and compares the input signal IN with a reference voltage VREF and accordingly outputs an amplified signal Rcv_n.

The first rail-to-rail amplifier circuit 130 includes a first differential amplifier circuit 132 and a second differential amplifier circuit 134. As shown in FIG. 2, the first differential amplifier circuit 132 and the second differential amplifier circuit 134 are complementary circuit configurations. That is, a P-type field-effect transistor and a N-type field-effect transistor are configured to be opposite to each other.

To be more specific, the first differential amplifier circuit 132 includes a first P-type field-effect transistor P1, a second P-type field-effect transistor P2, a first N-type field-effect transistor N1, and a second N-type field-effect transistor N2. First terminals of the first P-type field-effect transistor P1 and the second P-type field-effect transistor P2 are commonly coupled to the first node ND1. A control terminal of the first P-type field-effect transistor P1 receives the input signal IN. A control terminal of the second P-type field-effect transistor P2 receives the reference voltage VREF. A first terminal of the first N-type field-effect transistor N1 is coupled to a second terminal of the first P-type field-effect transistor P1. A first terminal of the second N-type field-effect transistor N2 is coupled to a second terminal of the second P-type field-effect transistor P2. Second terminals of the second N-type field-effect transistor N2 and the first N-type field-effect transistor N1 are commonly coupled to the second node ND2. Control terminals of the first N-type field-effect transistor N1 and the second N-type field-effect transistor N2 are commonly coupled to the first terminal of the second N-type field-effect transistor N2. Herein, the operating voltage VDD is, for example, 1.5 volts, and the reference voltage VREF is, for example, half of the operating voltage VDD.

The second differential amplifier circuit 134 includes a third P-type field-effect transistor P3, a fourth P-type field-effect transistor P4, a third N-type field-effect transistor N3, and a fourth N-type field-effect transistor N4. First terminals of the third P-type field-effect transistor P3 and the fourth P-type field-effect transistor P4 are commonly coupled to the first node ND1. Control terminals of the third P-type field-effect transistor P3 and the fourth P-type field-effect transistor P4 are commonly coupled to a second terminal of the third P-type field-effect transistor P3. The second terminal of the third P-type field-effect transistor P3 is coupled to the first terminal of the second N-type field-effect transistor N2. A second terminal of the fourth P-type field-effect transistor P4 is coupled to the first terminal of the first N-type field-effect transistor N1. A first terminal of the third N-type field-effect transistor N3 is coupled to the second terminal of the third P-type field-effect transistor P3. Second terminals of the third N-type field-effect transistor N3 and the fourth N-type field-effect transistor N4 are commonly coupled to the second node ND2. A control terminal of the third N-type field-effect transistor N3 receives the reference voltage VREF. A first terminal of the fourth N-type field-effect transistor N4 is coupled to the second terminal of the fourth P-type field-effect transistor P4, and the first terminal of the fourth N-type field-effect transistor N4 may provide the amplified signal Rcv_n. A control terminal of the fourth N-type field-effect transistor N4 receives the input signal IN.

The first rail-to-rail amplifier circuit 130 may detect whether the input signal IN is at the high logic level or at the low logic level by treating the reference voltage VREF as a basis. When a voltage of the input signal IN increases, an on-resistance of the first P-type field-effect transistor P1 increases, and an on-resistance of the fourth N-type field-effect transistor N4 decreases. As such, a voltage of the amplified signal Rcv_n provided on the first terminal of the fourth N-type field-effect transistor N4 may be pulled down.

Further, when a voltage of the reference voltage VREF increases, an on-resistance of the second P-type field-effect transistor P2 increases, and an on-resistance of the third N-type field-effect transistor N3 decreases. As such, a voltage of the control terminal of the first N-type field-effect transistor N1 decreases, and a voltage of the control terminal of the fourth P-type field-effect transistor P4 decreases. In this way, the voltage of the amplified signal Rcv_n provided on the first terminal of the fourth N-type field-effect transistor N4 may be pulled up. Based on the foregoing operating principle, when the input signal IN is greater than the reference voltage VREF, the voltage of the amplified signal Rcv_n is pulled down, so that the amplified signal Rcv_n at the low logic level may be outputted. When the input signal IN is less than the reference voltage VREF, the voltage of the amplified signal Rcv_n is pulled up, so that the amplified signal Rcv_n at the high logic level may be outputted.

The first inverter circuit 140 is, for example, a complementary metal-oxide-semiconductor (CMOS) inverter and is connected in parallel to the first rail-to-rail amplifier circuit 130 between the first node ND1 and the second node ND2. An input terminal of the first inverter circuit 140 receives the amplified signal Rcv_n. An output terminal of the first inverter circuit 140 provides an inverted signal Rcv_t.

The second inverter circuit 150 is, for example, a CMOS inverter as well. Different from the first inverter circuit 140, the second inverter circuit 150 is coupled between the operating voltage VDD and the ground voltage VSS. In the present embodiment, the second inverter circuit 150 receives the inverted signal Rcv_t and accordingly generates and outputs an output signal OUT. A voltage swing range of the output signal OUT is equal to the operating voltage VDD.

In the input receiver 100 provided by the disclosure, voltage swing ranges of the amplified signal Rcv_n and the inverted signal Rcv_t depend on voltage level sp of the first node ND1 and a voltage level sn (shown in FIG. 3) of the second node ND2. The first rail-to-rail amplifier circuit 130 may generate the amplified signal Rcv_n with a phase opposite to a phase of the input signal IN according to the input signal IN to amplify the voltage swing range to be between the voltage level sp and the voltage level sn. The first inverter circuit 140 may generate the inverted signal Rcv_t with a phase identical to the phase of the input signal IN according to the amplified signal Rcv_n to keep the voltage swing range to be between the voltage level sp and the voltage level sn.

Figure 3A:
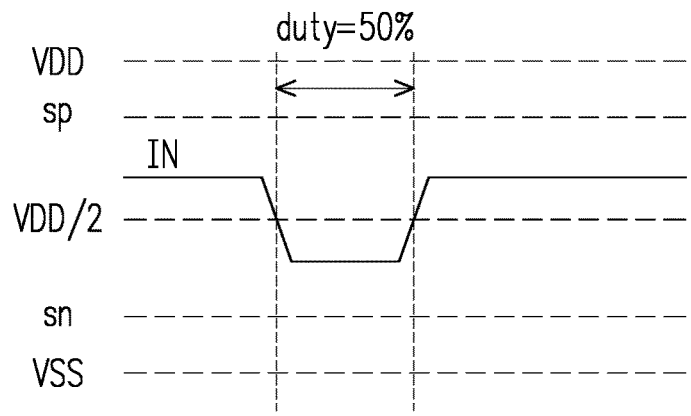
FIG. 3A to FIG. 3E are schematic diagrams illustrating signal waveforms of the input receiver according to an embodiment of the disclosure.
Figure 3B:
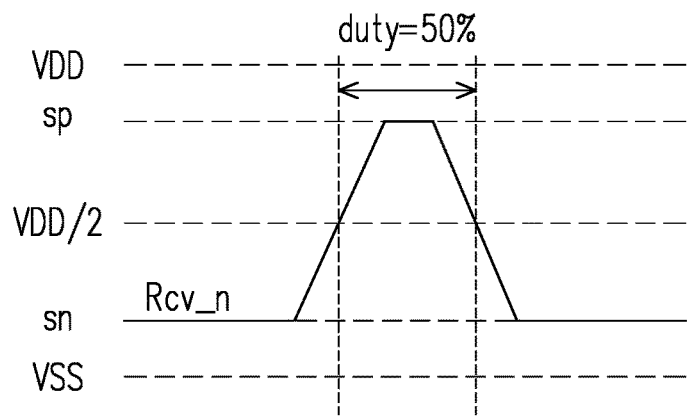
Figure 3C:
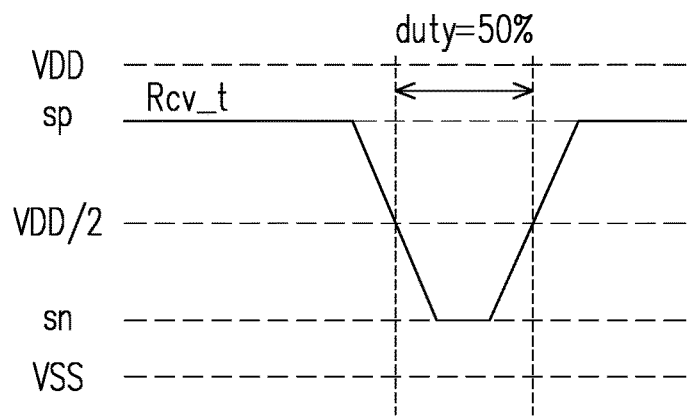
Figure 3D:
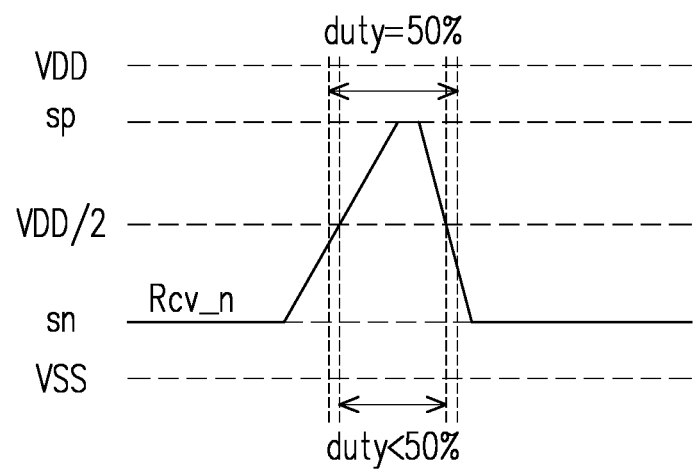

FIG. 3A to FIG. 3E are schematic diagrams illustrating signal waveforms of the input receiver according to an embodiment of the disclosure. With reference to FIG. 2 and FIG. 3A to FIG. 3E together, in this embodiment, as shown in FIG. 3A, a duty ration of the input signal IN is 50%, an average value of the voltage level sp and the voltage level sn is maintained to be half of the operating voltage VDD (equal to the reference voltage VREF). Ideally, as shown in FIG. 3B to FIG. 3C, duty ratios of the amplified signal Rcv_n and the inverted signal Rcv_t are both identical to the duty ratio of the input signal IN. For instance, the operating voltage VDD is 1.5 volts, the ground voltage VSS is 0 volts, the voltage level sp is 1.0 volt, and the voltage level sn is 0.5 volts, which should however not be construed as limitations to the disclosure.

In fact, level rising time and level fall time of the amplified signal Rcv_n may be different depending on process variations. For instance, when the produced P-type field-effect transistor has a high threshold voltage and the N-type field-effect transistor has a low threshold voltage, as shown in 3D, a rising slope of the amplified signal Rcv_n provided by the first rail-to-rail amplifier circuit 130 decreases, and a falling slope increases. As such, the duty ratio of the amplified signal Rcv_n may be less than 50%, and a duty broken situation thus occurs.

Figure 3E:
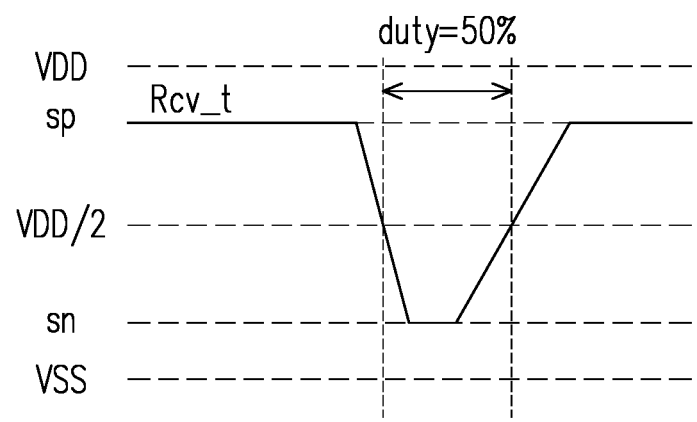

In this embodiment, since process conditions of the first inverter circuit 140 and the first rail-to-rail amplifier circuit 130 are identical, a slope of the inverted signal Rcv_t provided by the first inverter circuit 140 changes with the amplified signal Rcv_n. As shown in FIG. 3E, a falling slope of the inverted signal Rcv_t increases, and a rising slope of the inverted signal Rcv_t decreases, such that a decrease in duty ratio of the amplified signal Rcv_n may be compensated. In this way, the duty ratio of the inverted signal Rcv_t may be restored to 50% same as the duty ratio of the input signal IN.

Next, the second inverter circuit 150 may generate the output signal OUT with a phase opposite to the phase of the input signal IN according to the inverted signal Rcv_t to amplify the voltage swing range to be between the operating voltage VDD and the ground voltage VSS. Based on the above, in the input receiver 100 provided by the embodiments of the disclosure, the first inverter circuit 140 connected to the first rail-to-rail amplifier circuit 130 in parallel between the first node ND1 and the second node ND2 may be adopted to replace a shunt resistor provided in a conventional design. As such, the uneven duty ratio of the amplified signal Rcv_n may be compensated, and that operations may be correctly performed in a high-speed environment.

The input receiver 100 provided by the disclosure may further include a bias signal generator. The bias signal generator is configured to generate the first bias signal pbias and the second bias signal nbias. When the first bias signal pbias and the second bias signal nbias are appropriately configured, the average value of the voltage level sp and the voltage level sn is maintained to be equal to the reference voltage VREF.

Figure 4:
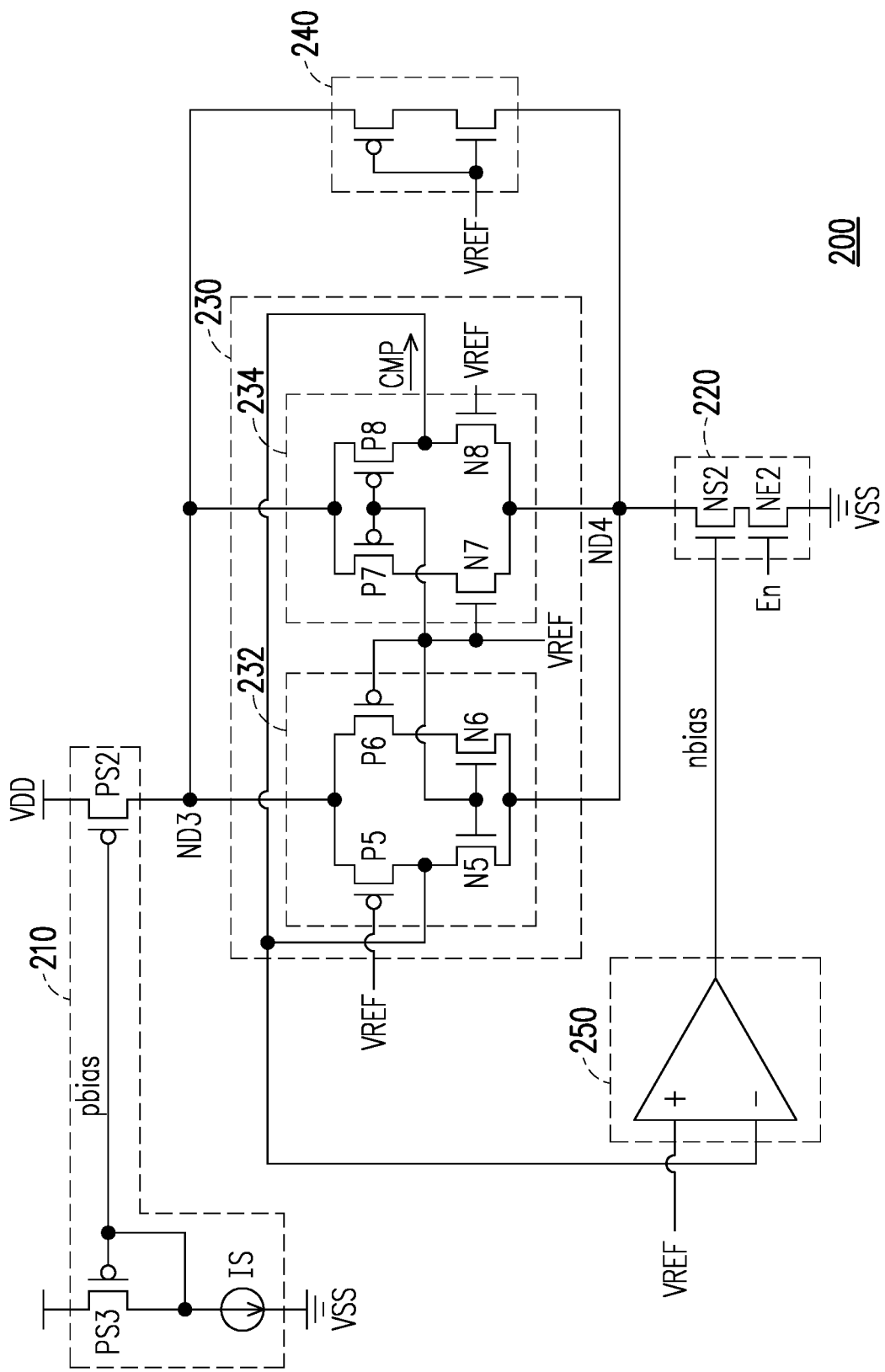
FIG. 4 is a schematic diagram of circuits of a bias signal generator according to an embodiment of the disclosure.

For instance, FIG. 4 is a schematic diagram of circuits of a bias signal generator according to an embodiment of the disclosure. In FIG. 4, a bias signal generator 200 includes a third current source circuit 210, a fourth current source circuit 220, a second rail-to-rail amplifier circuit 230, a third inverter circuit 240, and an operational amplifier circuit 250.

The third current source circuit 210 is coupled between the operating voltage VDD and a third node ND3. As shown in FIG. 4, the third current source circuit 210 includes a transistor PS2, a transistor PS3, and a current source IS, so as to provide a current to the third node ND3 through a current mirror formed by the transistors PS2 and PS3. The third current source circuit 210 may provide the first bias signal pbias according to a current generated by the current source IS.

The fourth current source circuit 220 is coupled between a fourth node ND4 and the ground voltage VSS. The fourth current source circuit 220 may adjust a current flowing through the fourth node ND4 according to the second bias signal nbias. As shown in FIG. 4, the fourth current source circuit 220 includes a current source formed by a transistor NS2 and an enabling transistor NE2. The transistor NS2 may provide a current flowing through the fourth node ND4 according to the second bias signal nbias. The enabling transistor NE2 is connected in series to the transistor NS2 on a circuit path between the fourth node ND4 and the ground voltage VSS and is turned on or turned off according to the enabled signal En. The enabled signal En indicates that whether the bias signal generator 200 is enabled. For instance, when the enabled signal En is at a low logic level, the enabling transistor NE2 is turned off, and the bias signal generator 200 may not function. When the enabled signal En is at a high logic level, the enabling transistor NE2 is turned on, and the bias signal generator 200 may function. In this embodiment, the enabling transistor NE2 is coupled between the transistor NS2 and the ground voltage VSS, but in another embodiment, the enabling transistor NE2 may also be coupled between the fourth node ND4 and the transistor NS2, and which should not be construed as limitations to the disclosure.

The second rail-to-rail amplifier circuit 230 is coupled between the third node ND3 and the fourth node ND4. The second rail-to-rail amplifier circuit 230 includes a third differential amplifier circuit 232 and a fourth differential amplifier circuit 234. As shown in FIG. 4, the third differential amplifier circuit 232 and the fourth differential amplifier circuit 234 are complementary circuit configurations.

To be more specific, the third differential amplifier circuit 232 includes a fifth P-type field-effect transistor P5, a sixth P-type field-effect transistor P6, a fifth N-type field-effect transistor N5, and a sixth N-type field-effect transistor N6. The third differential amplifier circuit 232 and the first differential amplifier circuit 132 are almost identical, but a difference therebetween is that a control terminal of the fifth P-type field-effect transistor P5 of the third differential amplifier circuit 232 receives the reference voltage VREF.

The fourth differential amplifier circuit 234 includes a seventh P-type field-effect transistor P7, an eighth P-type field-effect transistor P8, a seventh N-type field-effect transistor N7, and an eighth N-type field-effect transistor N8. The fourth differential amplifier circuit 234 and the second differential amplifier circuit 134 are almost identical, but a difference therebetween is that a control terminal of the eighth N-type field-effect transistor N8 of the fourth differential amplifier circuit 234 receives the reference voltage VREF, and a first terminal of the eighth N-type field-effect transistor N8 provides a comparison signal CMP to the operational amplifier circuit 250 and a node between the fifth P-type field-effect transistor P5 and the sixth P-type field-effect transistor P6. Based on the above circuit configuration, the second rail-to-rail amplifier circuit 230 may output the comparison signal CMP to the operational amplifier circuit 250 according to the reference voltage VREF.

The third inverter circuit 240 is, for example, a complementary metal-oxide-semiconductor (CMOS) inverter and is connected in parallel to the second rail-to-rail amplifier circuit 230 between the third node ND3 and the fourth node ND4. An input terminal of the third inverter circuit 240 receives the reference voltage VREF as well.

A non-inverted input terminal of the operational amplifier circuit 250 receives the reference voltage VREF. An inverted input terminal of the operational amplifier circuit 250 receives the comparison signal CMP. An output terminal of the operational amplifier circuit 250 outputs the second bias signal nbias to the fourth current source circuit 220. Based on the foregoing circuit configuration, the bias signal generator 200 may generate an appropriate first bias signal pbias and an appropriate second bias signal nbias, so that the average value of the voltage level sp and the voltage level sn is maintained to be equal to the reference voltage VREF.

Figure 5:
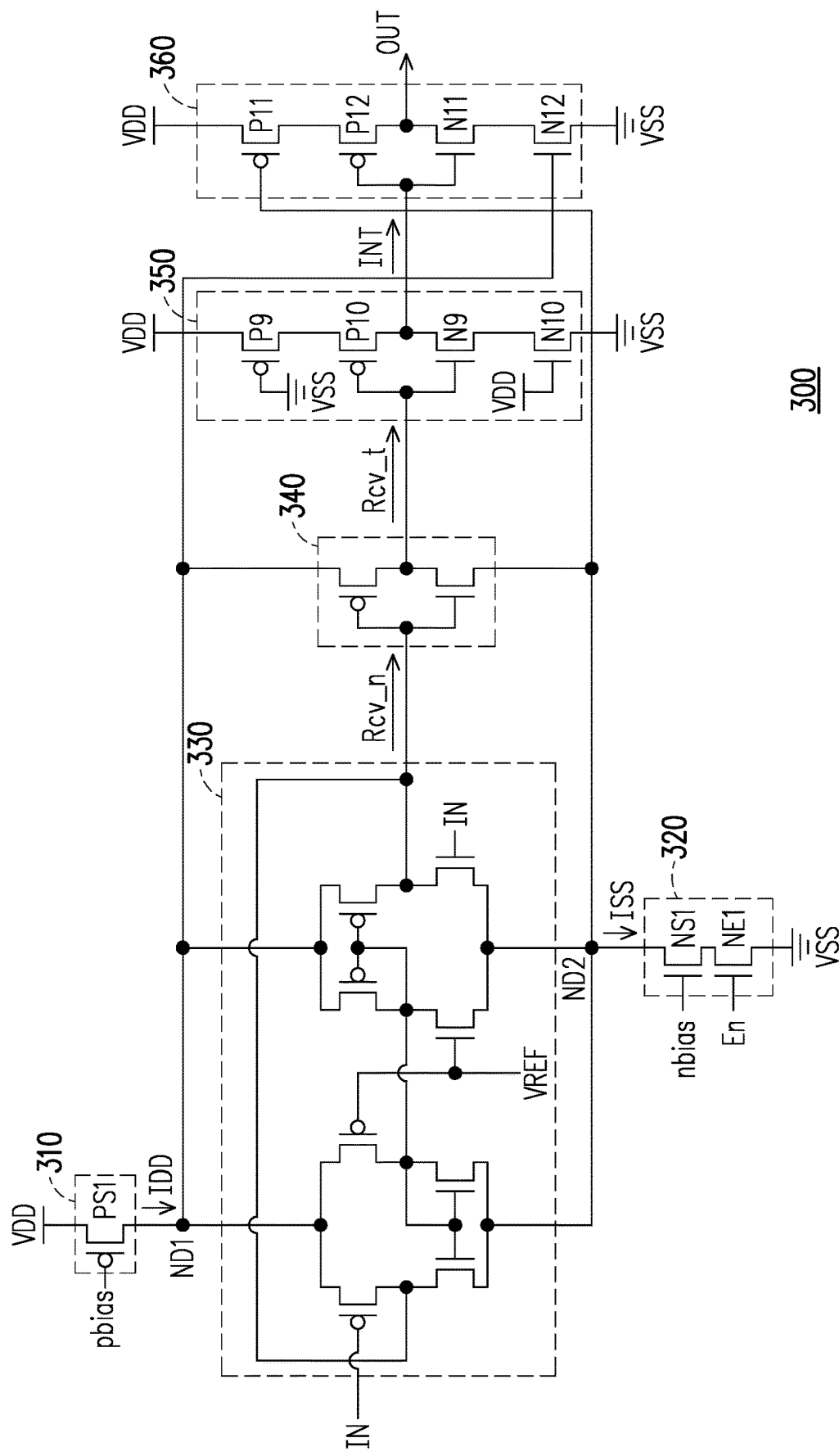
FIG. 5 is a schematic diagram illustrating circuits of an input receiver according to another embodiment of the disclosure.

FIG. 5 is a schematic diagram illustrating circuits of an input receiver according to another embodiment of the disclosure. In the present embodiment, an input receiver 300 includes a first current source circuit 310, a second current source circuit 320, a first rail-to-rail amplifier circuit 330, and a first inverter circuit 340. The functions of the above devices are identical or similar to the functions of the corresponding devices in the foregoing embodiments, such that details description thereof is not repeated herein.

Different from the foregoing embodiments, in the present embodiment, the input receiver 300 further includes a fourth inverter circuit 350 between a second inverter circuit 360 and the first inverter circuit 340, and the second inverter circuit 360 replaces the second inverter circuit 150. As shown in FIG. 5, the fourth inverter circuit 350 includes a ninth P-type field-effect transistor P9, a tenth P-type field-effect transistor P10, a ninth N-type field-effect transistor N9, and a tenth N-type field-effect transistor N10. A first terminal of the ninth P-type field-effect transistor P9 receives the operating voltage VDD. A control terminal of the ninth P-type field-effect transistor P9 receives the ground voltage VSS. A first terminal of the tenth P-type field-effect transistor P10 is coupled to a second terminal of the ninth P-type field-effect transistor P9. A second terminal of the tenth P-type field-effect transistor P10 provides an intermediate signal INT. A control terminal of the tenth P-type field-effect transistor P10 receives the inverted signal Rcv_t. A first terminal of the ninth N-type field-effect transistor N9 is coupled to the second terminal of the tenth P-type field-effect transistor P10. A control terminal of the ninth N-type field-effect transistor N9 receives the inverted signal Rcv_t. A first terminal of the tenth N-type field-effect transistor N10 is coupled to a second terminal of the ninth N-type field-effect transistor N9. A second terminal of the tenth N-type field-effect transistor N10 is coupled to the ground voltage VSS. A control terminal of the tenth N-type field-effect transistor N10 receives the operating voltage VDD.

As shown in FIG. 5, the second inverter circuit 360 includes an eleventh P-type field-effect transistor P11, a twelfth P-type field-effect transistor P12, an eleventh N-type field-effect transistor N11, and a twelfth N-type field-effect transistor N12. A first terminal of the eleventh P-type field-effect transistor P11 receives the operating voltage VDD. A control terminal of the eleventh P-type field-effect transistor P11 is coupled to the second node ND2. A first terminal of the twelfth P-type field-effect transistor P12 is coupled to a second terminal of the eleventh P-type field-effect transistor P11. A second terminal of the twelfth P-type field-effect transistor P12 provides the output signal OUT. A control terminal of the twelfth P-type field-effect transistor P12 receives the intermediate signal INT. A first terminal of the eleventh N-type field-effect transistor N11 is coupled to the second terminal of the twelfth P-type field-effect transistor P12. A control terminal of the eleventh N-type field-effect transistor N11 receives the intermediate signal INT. A first terminal of the twelfth N-type field-effect transistor N12 is coupled to a second terminal of the eleventh N-type field-effect transistor N11. A second terminal of the twelfth N-type field-effect transistor N12 is coupled to the ground voltage VSS. A control terminal of the twelfth N-type field-effect transistor N12 is coupled to the first node ND1.

Based on the above, the fourth inverter circuit 350 is added to the input receiver 300 in the embodiments of the disclosure. In this way, one more level is added to the inverter circuit structure, and favorable performance is thereby accordingly obtained. In addition, the second inverter circuit 360 configured to provide the output signal OUT is further controlled by voltages of the second node ND2 and the first node ND1, voltage swing thereof may thus be decreased.

In view of the foregoing, in the input receiver provided by the disclosure, the inverter circuit and the rail-to-rail amplifier circuit are connected in parallel between two nodes. The inverter circuit may be configured to compensate the amplified signal outputted by the rail-to-rail amplifier circuit, so that the duty ratio of the inverted signal outputted by the inverter circuit may be restored to be equal to the duty ratio of the signal inputted to the rail-to-rail amplifier circuit. Accordingly, the input receiver may not only perform operations correctly in a high-speed environment but also may work at a high operating speed and require low power consumption.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An input receiver, comprising:
   a first current source circuit, coupled between an operating voltage and a first node, configured to adjust an operating current flowing through the first node according to a first bias signal;
   a second current source circuit, coupled between a second node and a ground voltage, configured to adjust a ground current flowing through the second node according to a second bias signal;
   a first rail-to-rail amplifier circuit, coupled between the first node and the second node, configured to receive an input signal and compare the input signal with a reference voltage to accordingly output an amplified signal;
   a first inverter circuit, connected in parallel to the first rail-to-rail amplifier circuit between the first node and the second node, configured to receive the amplified signal and provide and inverted signal; and
   a second inverter circuit, coupled between the operating voltage and the ground voltage, configured to generate an output signal according to the inverted signal.

2. The input receiver according to claim 1, wherein the second current source circuit comprises:
   a current source, configured to adjust the ground current according to the second bias signal; and
   an enabling transistor, connected in series to the current source on a circuit path between the second node and the ground voltage, configured to be turned on or turned off according to an enabled signal.

3. The input receiver according to claim 1, wherein the first rail-to-rail amplifier circuit comprises a first differential amplifier circuit and a second differential amplifier circuit, and the first differential amplifier circuit and the second differential amplifier circuit are complementary circuit configurations.

4. The input receiver according to claim 3, wherein the first differential amplifier circuit comprises:

a first P-type field-effect transistor, a first terminal thereof coupled to the first node, a control terminal of the first P-type field-effect transistor receiving the input signal;

a second P-type field-effect transistor, a first terminal thereof coupled to the first node, a control terminal of the second P-type field-effect transistor receiving the reference voltage;

a first N-type field-effect transistor, a first terminal thereof coupled to a second terminal of the first P-type field-effect transistor, a second terminal of the first N-type field-effect transistor coupled to the second node; and a second N-type field-effect transistor, a first terminal thereof coupled to a second terminal of the second P-type field-effect transistor, a second terminal of the second N-type field-effect transistor coupled to the second node, a control terminal of the second N-type field-effect transistor coupled to the first terminal of the second N-type field-effect transistor and a control terminal of the first N-type field-effect transistor, wherein the second differential amplifier circuit comprises:

a third P-type field-effect transistor, a first terminal thereof coupled to the first node, a second terminal of the third P-type field-effect transistor coupled to a control terminal of the third P-type field-effect transistor and the first terminal of the second N-type field-effect transistor;

a fourth P-type field-effect transistor, a first terminal thereof coupled to the first node, a second terminal of the fourth P-type field-effect transistor coupled to the first terminal of the first N-type field-effect transistor, a control terminal of the fourth P-type field-effect transistor coupled to the control terminal of the third P-type field-effect transistor;

a third N-type field-effect transistor, a first terminal thereof coupled to the second terminal of the third P-type field-effect transistor, a second terminal of the third N-type field-effect transistor coupled to the second node, a control terminal of the third N-type field-effect transistor receiving the reference voltage; and a fourth N-type field-effect transistor, a first terminal thereof coupled to the second terminal of the fourth P-type field-effect transistor and providing the amplified signal, a second terminal of the fourth N-type field-effect transistor coupled to the second node, a control terminal of the fourth N-type field-effect transistor receiving the input signal.

5. The input receiver according to claim 1, further comprising: a bias signal generator, comprising:

a third current source circuit, coupled between the operating voltage and the third node, wherein the third current source circuit comprises a first current source and is configured to provide the first bias signal and a current flowing through the third node according to the first current source;

a fourth current source circuit, coupled between a fourth node and the ground voltage, configured to adjust a current flowing through the fourth node according to the second bias signal;

a second rail-to-rail amplifier circuit, coupled between the third node and the fourth node, configured to output a comparison signal according to the reference voltage;

a third inverter circuit, connected in parallel to the second rail-to-rail amplifier circuit between the third node and the fourth node, configured to receive the reference voltage; and an operational amplifier circuit, configured to receive the reference voltage and the comparison signal and output the second bias signal.

6. The input receiver according to claim 5, wherein the fourth current source circuit comprises:

a second current source, configured to adjust a current flowing through the fourth node according to the second bias signal; and an enabling transistor, connected in series to the second current source on a circuit path between the fourth node and the ground voltage, configured to be turned on or turned off according to an enabled signal.

7. The input receiver according to claim 5, wherein the second rail-to-rail amplifier circuit comprises a third differential amplifier circuit and a fourth differential amplifier circuit, and the third differential amplifier circuit and the fourth differential amplifier circuit are complementary circuit configurations.

8. The input receiver according to claim 7, wherein the third differential amplifier circuit comprises:

a fifth P-type field-effect transistor, a first terminal thereof coupled to the third node, a control terminal of the fifth P-type field-effect transistor receiving the reference voltage;

a sixth P-type field-effect transistor, a first terminal thereof coupled to the third node, a control terminal of the sixth P-type field-effect transistor receiving the reference voltage;

a fifth N-type field-effect transistor, a first terminal thereof coupled to a second terminal of the fifth P-type field-effect transistor, a second terminal of the fifth N-type field-effect transistor coupled to the fourth node, a control terminal of the fifth N-type field-effect transistor receiving the reference voltage; and a sixth N-type field-effect transistor, a first terminal thereof coupled to a second terminal of the sixth P-type field-effect transistor, a second terminal of the sixth N-type field-effect transistor coupled to the fourth node, a control terminal of the sixth N-type field-effect transistor receiving the reference voltage, wherein the fourth differential amplifier circuit comprises:

a seventh P-type field-effect transistor, a first terminal thereof coupled to the third node, a control terminal of the seventh P-type field-effect transistor receiving the reference voltage;

an eighth P-type field-effect transistor, a first terminal thereof coupled to the third node, a second terminal of the eighth P-type field-effect transistor coupled to the first terminal of the fifth N-type field-effect transistor, a control terminal of the eighth P-type field-effect transistor receiving the reference voltage;

a seventh N-type field-effect transistor, a first terminal thereof coupled to a second terminal of the seventh P-type field-effect transistor, a second terminal of the seventh N-type field-effect transistor coupled to the fourth node, a control terminal of the seventh N-type field-effect transistor receiving the reference voltage; and an eighth N-type field-effect transistor, a first terminal thereof coupled to the second terminal of the eighth P-type field-effect transistor and providing the comparison signal, a second terminal of the eighth N-type field-effect transistor coupled to the fourth node, a control terminal of the eighth N-type field-effect transistor receiving the reference voltage.

9. The input receiver according to claim 1, further comprising:

a fourth inverter circuit, coupled between the first inverter circuit and the second inverter circuit, configured to receive the amplified signal to provide an intermediate signal to the second inverter circuit.

10. The input receiver according to claim 9, wherein the fourth inverter circuit comprises:
   a ninth P-type field-effect transistor, a first terminal thereof coupled to the operating voltage, a control terminal of the ninth P-type field-effect transistor receiving the ground voltage;
   a tenth P-type field-effect transistor, a first terminal thereof coupled to a second terminal of the ninth P-type field-effect transistor, a second terminal of the tenth P-type field-effect transistor providing the output signal, a control terminal of the tenth P-type field-effect transistor receiving the inverted signal;
   a ninth N-type field-effect transistor, a first terminal thereof coupled to the second terminal of the tenth P-type field-effect transistor, a control terminal of the ninth N-type field-effect transistor receiving the inverted signal; and
   a tenth N-type field-effect transistor, a first terminal thereof coupled to a second terminal of the ninth N-type field-effect transistor, a second terminal of the tenth N-type field-effect transistor receiving the ground voltage, a control terminal of the tenth N-type field-effect transistor receiving the operating voltage.

11. The input receiver according to claim 9, wherein the second inverter circuit is configured to be controlled by voltages on the first node and the second node, and the second inverter circuit receives the intermediate signal to output the output signal.

12. The input receiver according to claim 11, wherein the second inverter circuit comprises:
   an eleventh P-type field-effect transistor, a first terminal thereof coupled to the operating voltage, a control terminal of the eleventh P-type field-effect transistor coupled to the second node;
   a twelfth P-type field-effect transistor, a first terminal thereof coupled to a second terminal of the eleventh P-type field-effect transistor, a second terminal of the twelfth P-type field-effect transistor providing the output signal, a control terminal of the twelfth P-type field-effect transistor receiving the intermediate signal;
   an eleventh N-type field-effect transistor, a first terminal thereof coupled to the second terminal of the twelfth P-type field-effect transistor, a control terminal of the eleventh N-type field-effect transistor receiving the intermediate signal; and
   a twelfth N-type field-effect transistor, a first terminal thereof coupled to a second terminal of the eleventh N-type field-effect transistor, a second terminal of the twelfth N-type field-effect transistor receiving the ground voltage, a control terminal of the twelfth N-type field-effect transistor coupled to the first node.

* * * * *